(12) United States Patent
Na et al.

(10) Patent No.: US 7,656,152 B2
(45) Date of Patent: Feb. 2, 2010

(54) PUSHER FOR MATCH PLATE OF TEST HANDLER

(75) Inventors: Yun Sung Na, Cheunan (KR); In Gu Jeon, Suwon (KR); Dong Han Kim, Suwon (KR); Jae woo Jang, Seongnam (KR)

(73) Assignee: TechWing Co. Ltd, Hwaseung (KR)

( * ) Notice: Subject to any disclaimer, the term of this patent is extended or adjusted under 35 U.S.C. 154(b) by 0 days.

(21) Appl. No.: 12/044,181

(22) Filed: Mar. 7, 2008

(65) Prior Publication Data

US 2008/0231260 A1 Sep. 25, 2008

(30) Foreign Application Priority Data

Mar. 21, 2007 (KR) ...................... 10-2007-0027438
May 16, 2007 (KR) ...................... 10-2007-0047519

(51) Int. Cl.
*G01R 31/28* (2006.01)
*G01R 31/02* (2006.01)
(52) U.S. Cl. .................................... 324/158.1; 324/760
(58) Field of Classification Search ........................ None
See application file for complete search history.

(56) References Cited

U.S. PATENT DOCUMENTS 6,445,203 B1 * 9/2002 Yamashita et al. .......... 324/760
6,932,635 B2 * 8/2005 Ishikawa et al. ............ 439/190

* cited by examiner

*Primary Examiner*—Ha Tran T Nguyen
*Assistant Examiner*—Roberto Velez
(74) *Attorney, Agent, or Firm*—Jefferson IP Law, LLP

(57) ABSTRACT

A pusher for a match plate of a test handler is disclosed which assists a tester to test the produced semiconductor devices. The pusher includes: a body part installed to an installation plate; and a pushing part that extends forward from a front side of the body part, for pushing a semiconductor device placed on an insert of a test tray. The pusher forms: an air through hole that extends through from a rear side of the body part to the front side of the pushing part, for guiding air of a certain temperature, supplied to the rear side of the body part from a duct, to be supplied to the semiconductor device; and at least one or more air outflow holes that extend through from at least one side of the pushing part and communicate with the air through hole, for allowing part of the air supplied from the duct through the air through hole to flow out to a test site. The pusher can reduce the temperature deviation of semiconductor devices at the test site.

5 Claims, 10 Drawing Sheets

[FIG. 1]
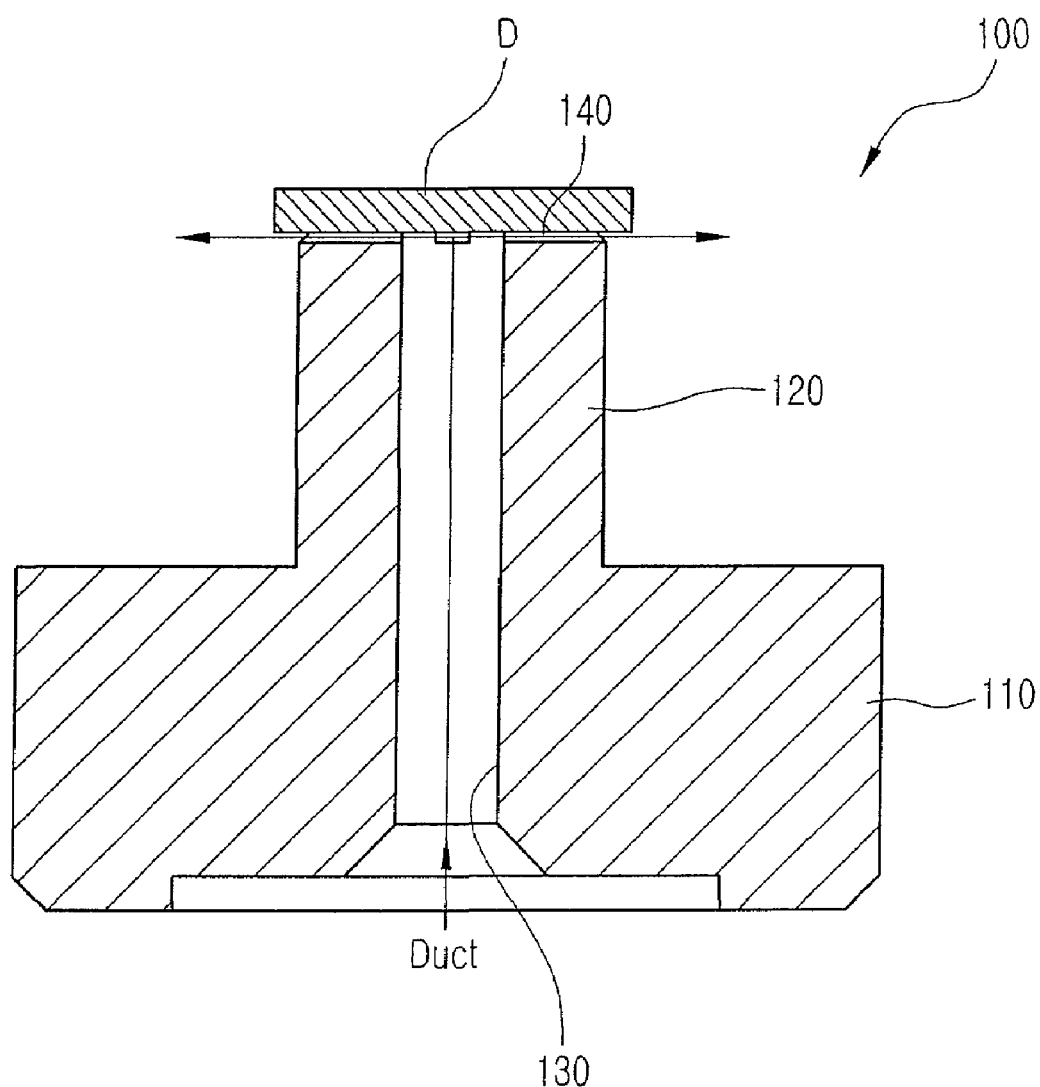

[FIG. 2]
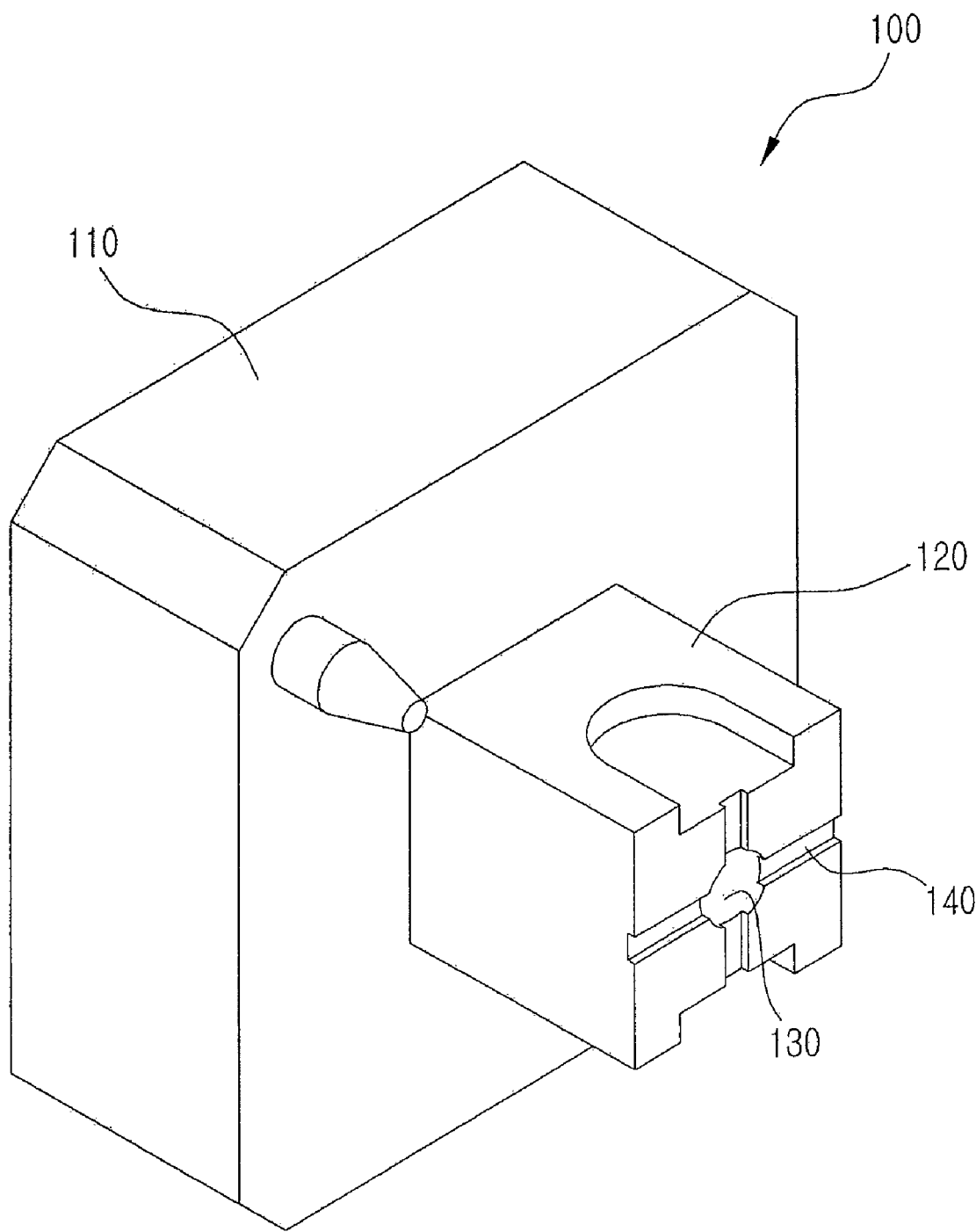

[FIG. 3]
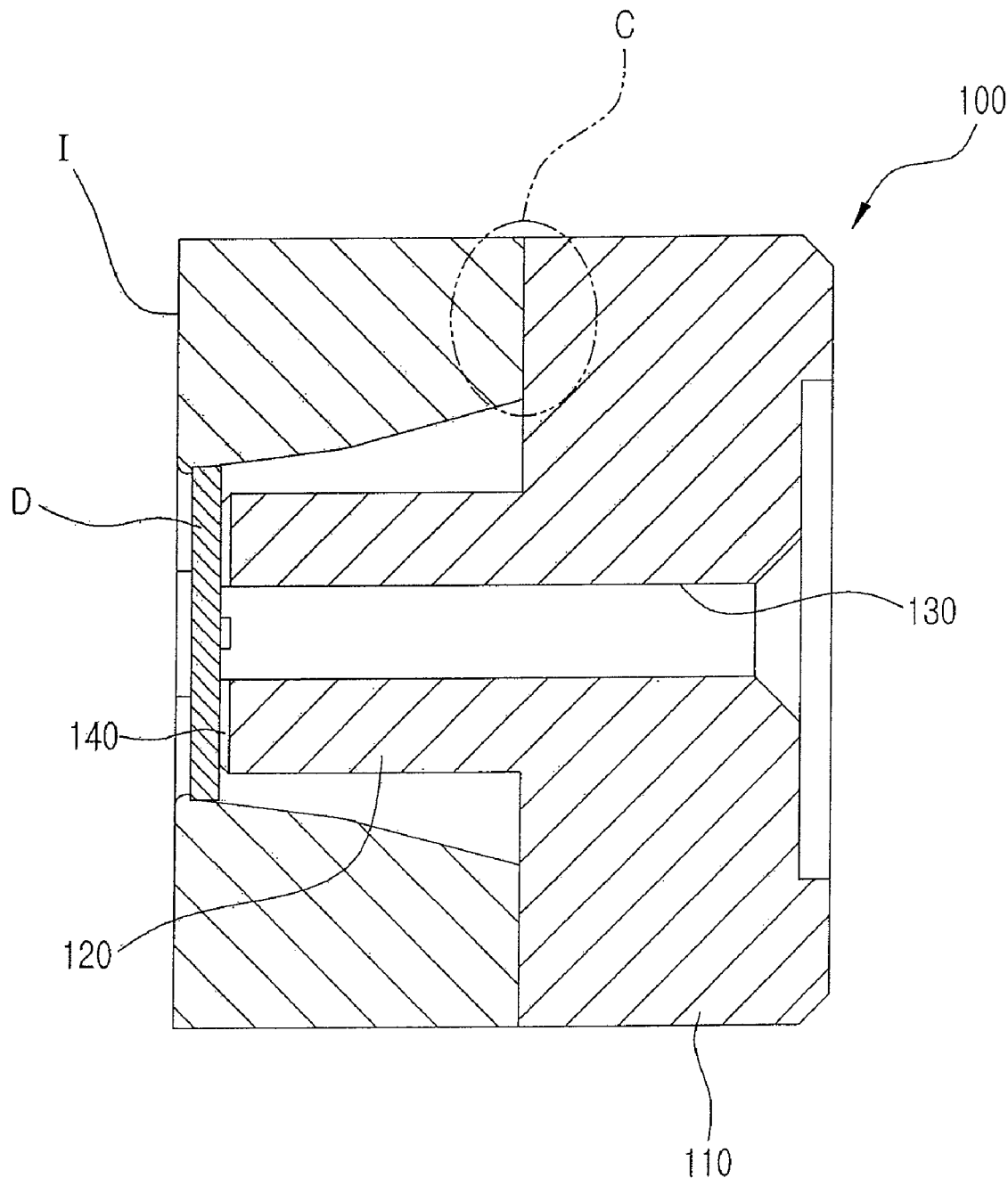

[FIG. 4]
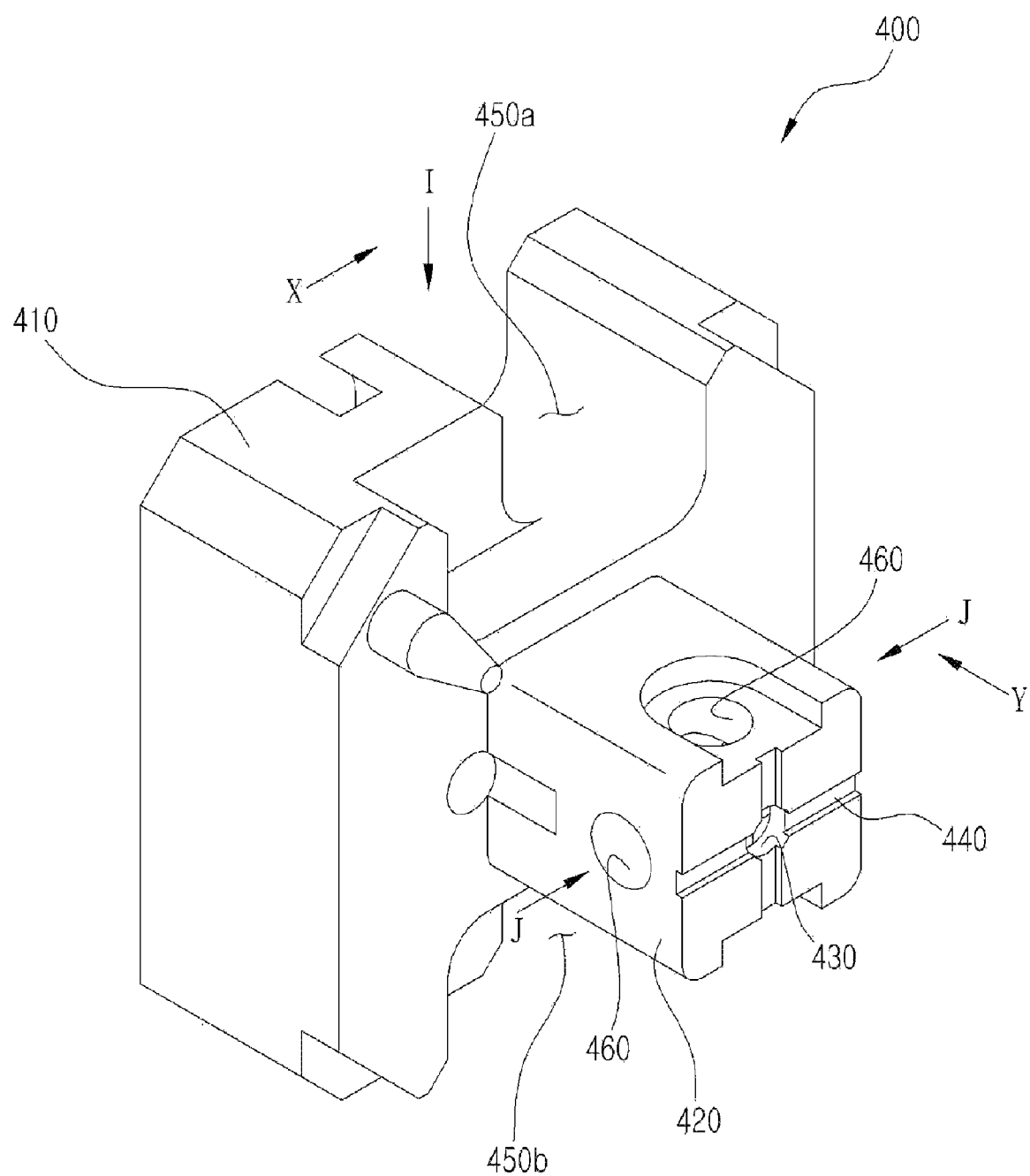

[FIG. 5]
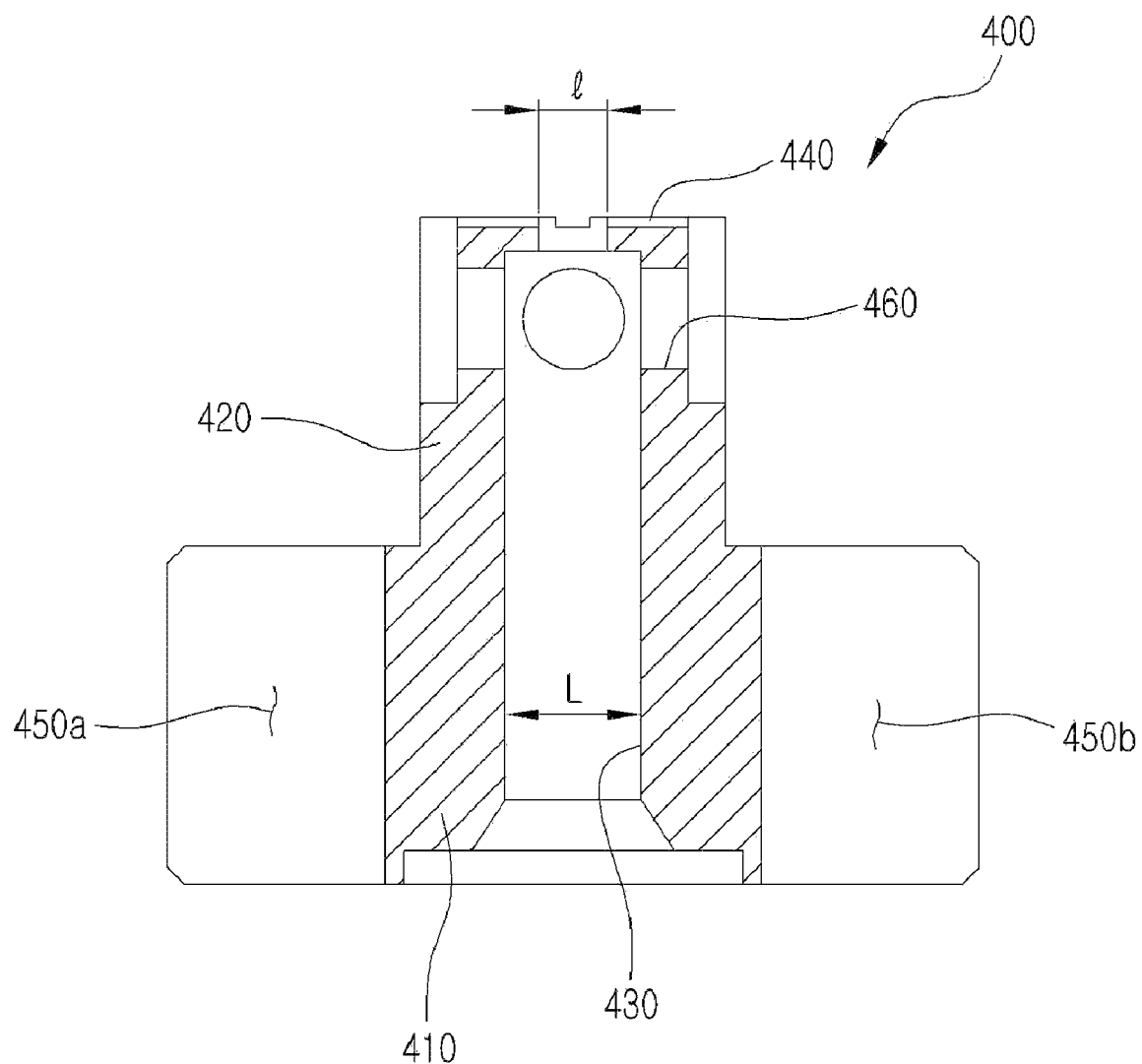

[FIG. 6]
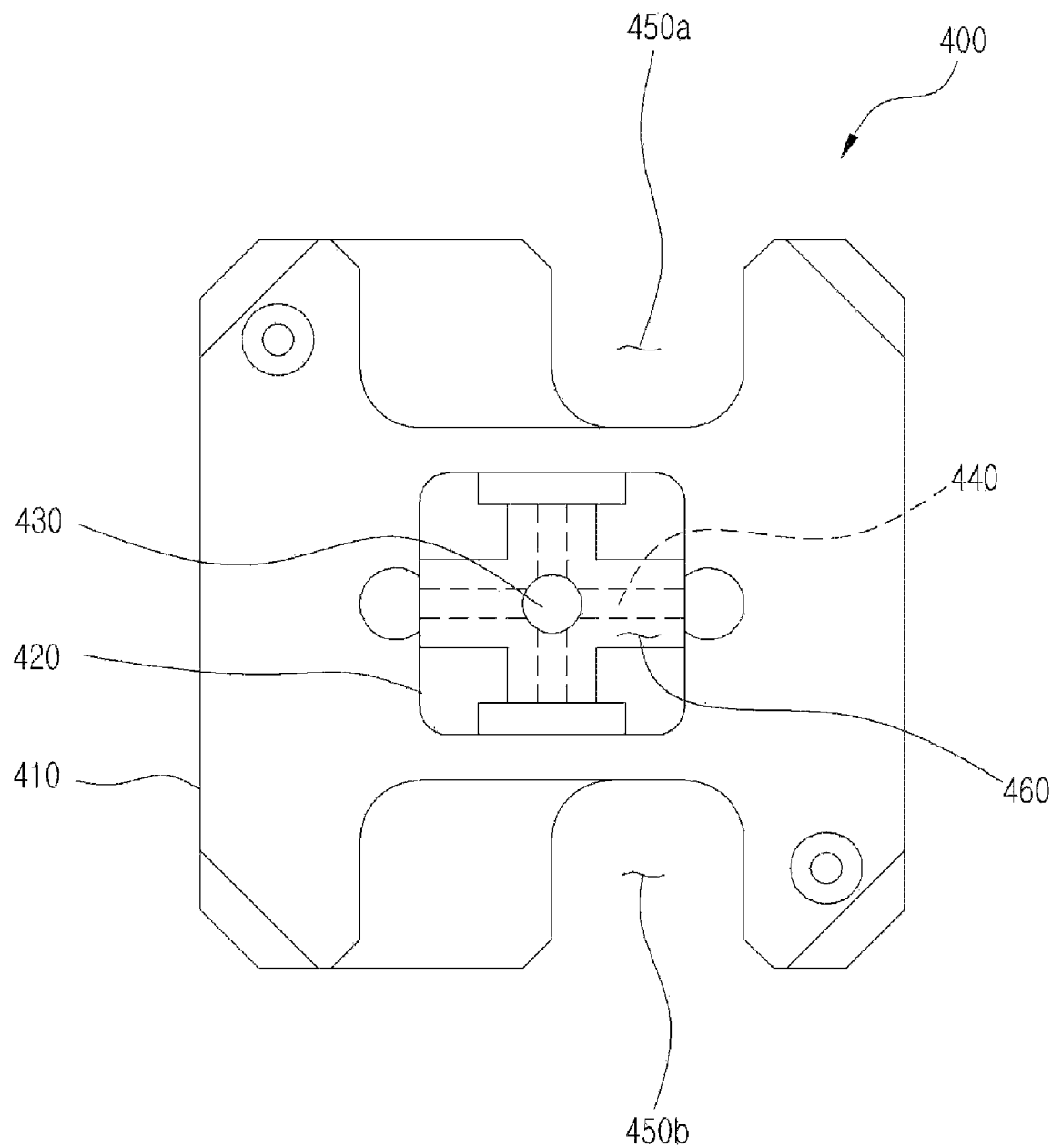

[FIG. 7]
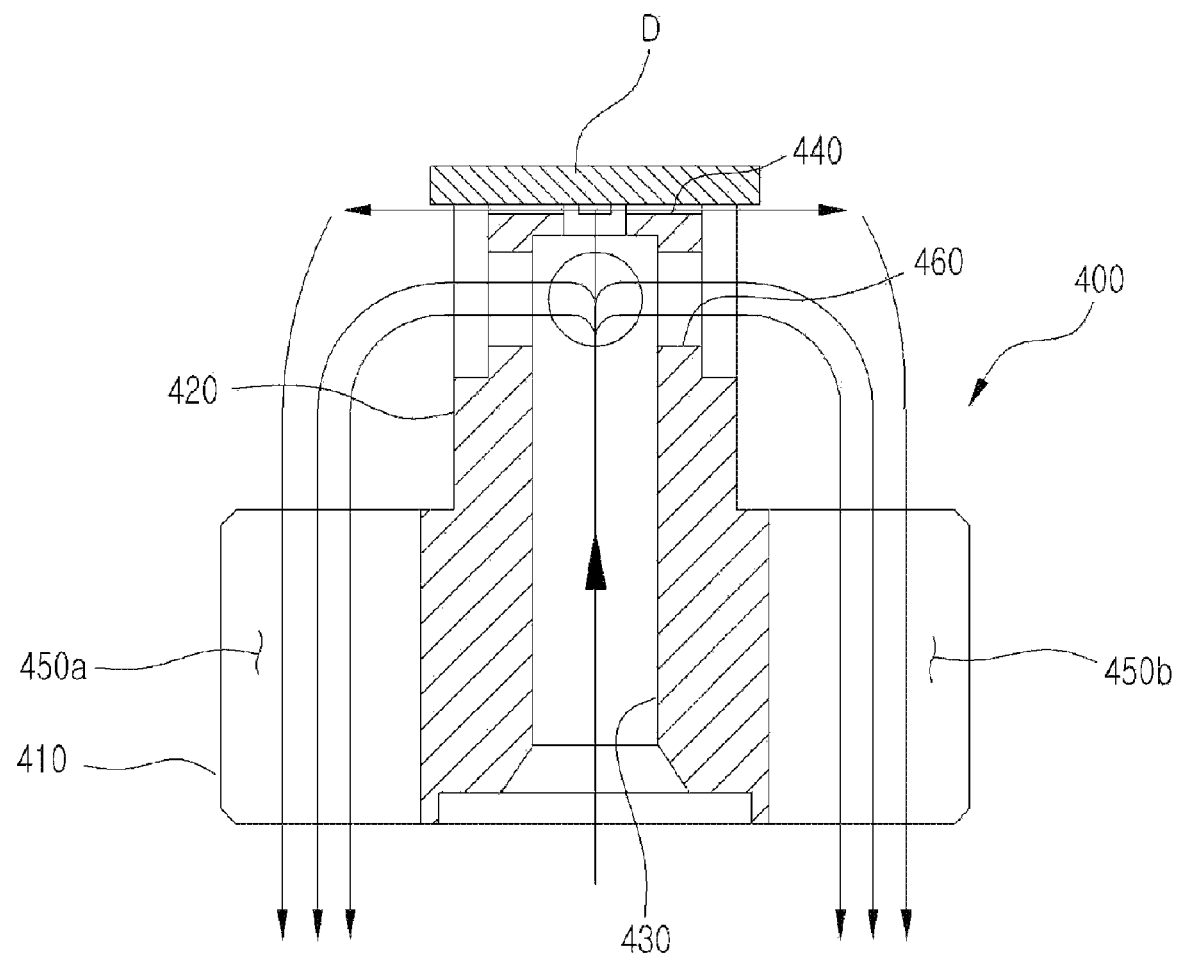

[FIG. 8]
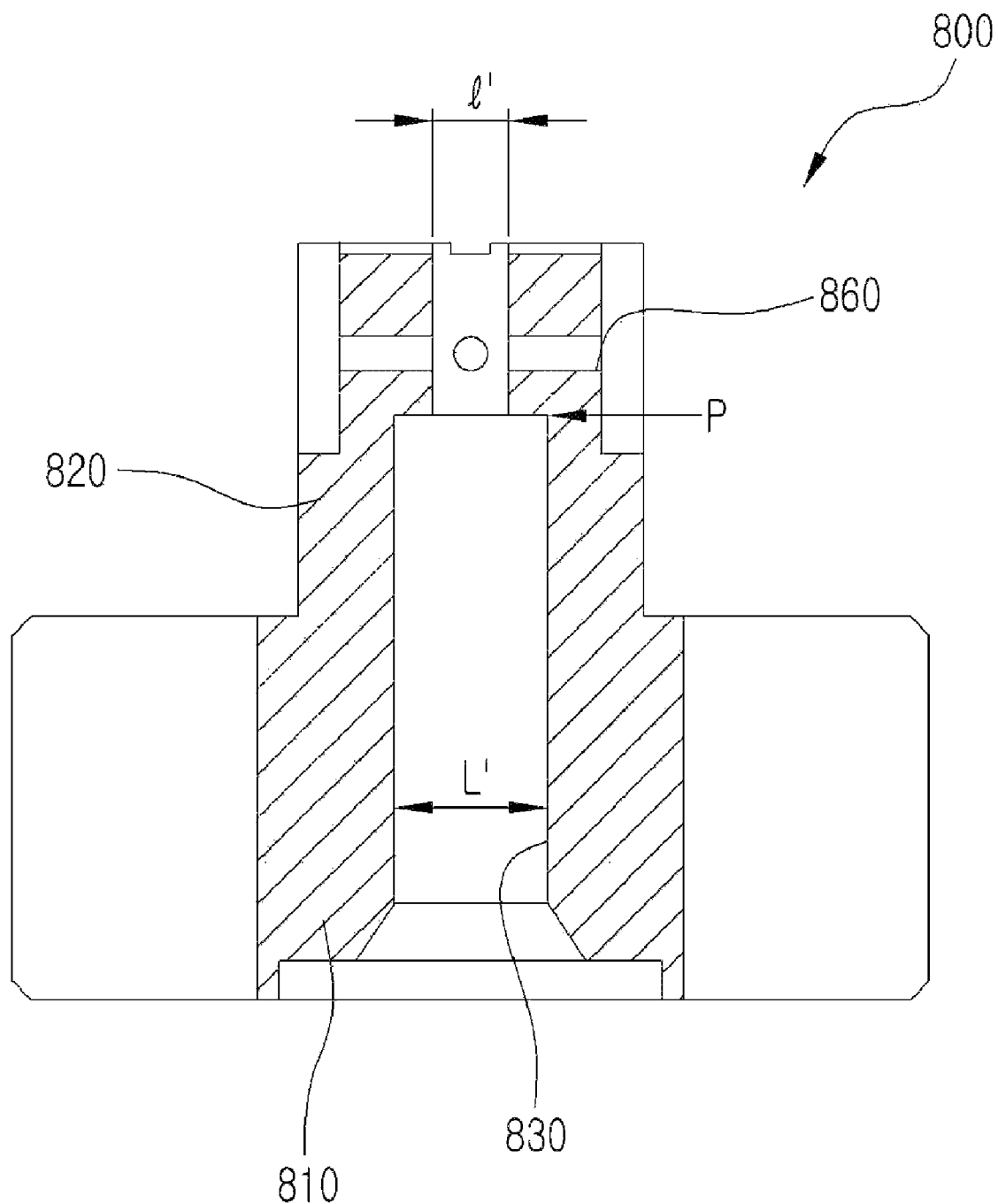

[FIG. 9]
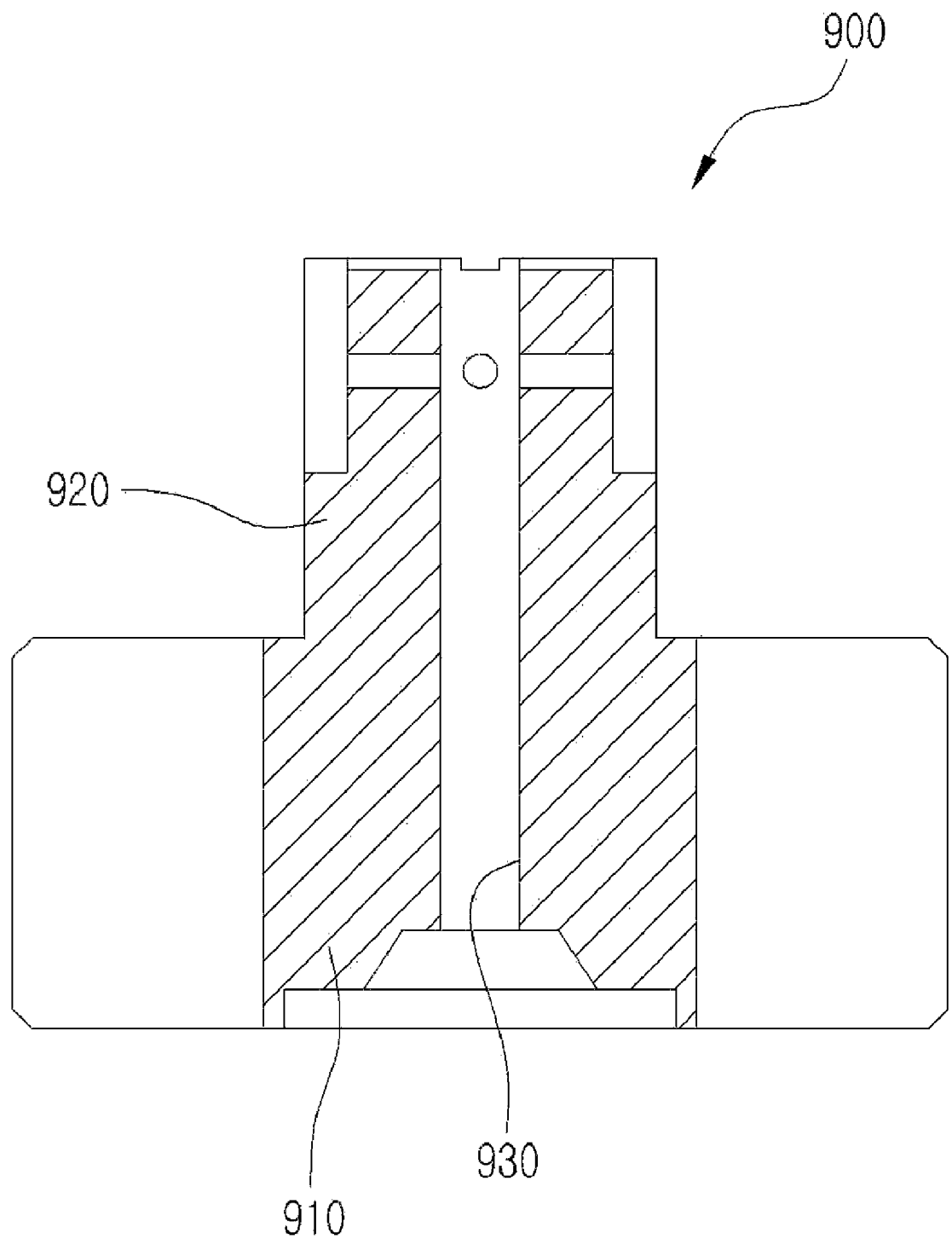

[FIG. 10]
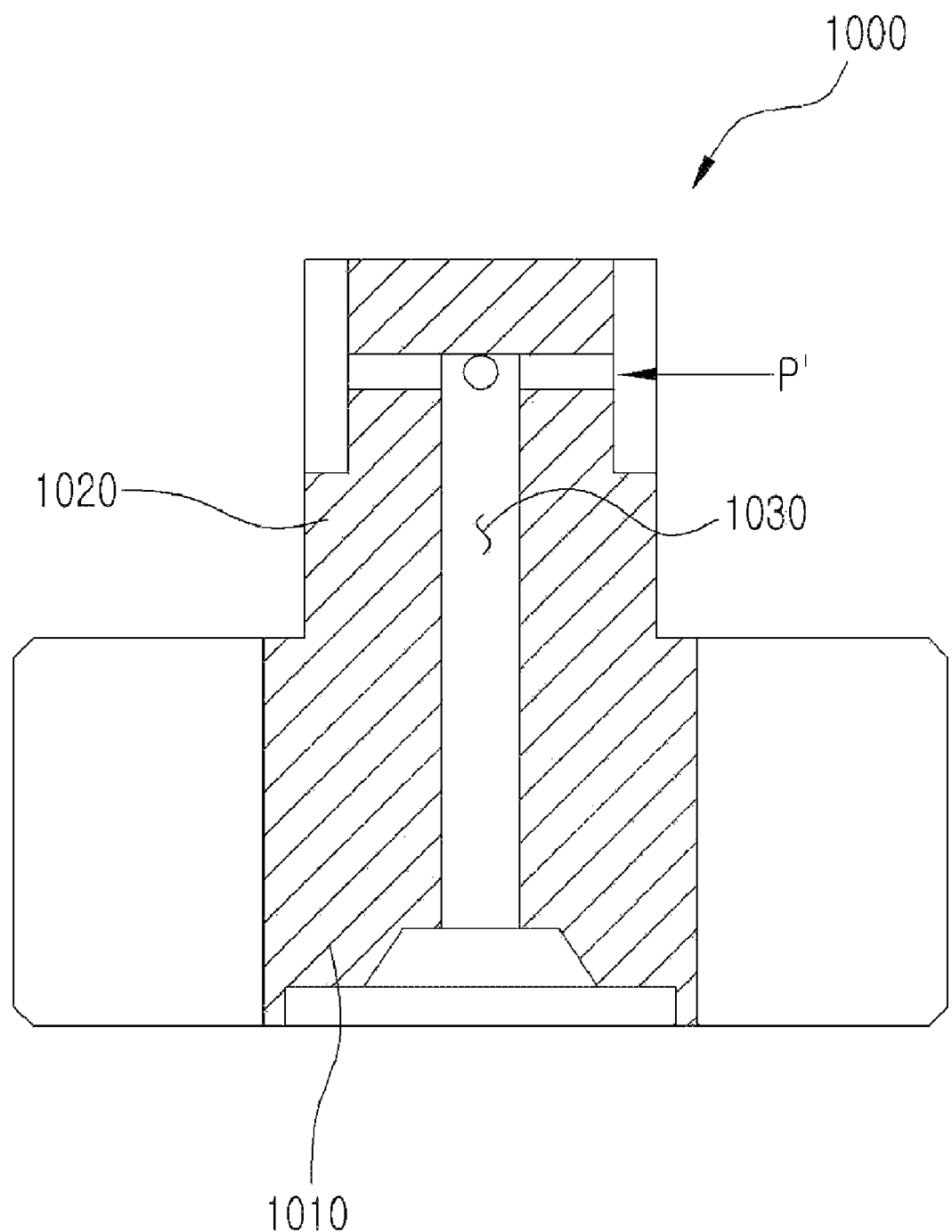

PUSHER FOR MATCH PLATE OF TEST HANDLER

PRIORITY

This application claims the benefit under 35 U.S.C. §119 (a) of Korean patent applications filed in the Korean Industrial Property Office on Mar. 21, 2007 and assigned Ser. No. 2007-27438, and filed on May 16, 2007 and assigned Ser. No. 2007-47519, the entire disclosures of both of which are hereby incorporated by reference.

BACKGROUND OF THE INVENTION

1. Field of the Invention

The present invention relates to a test handler, and more particularly, to a pusher for a match plate of a test handler that supports a tester to test the produced semiconductor devices.

2. Description of the Related Art

A test handler is a piece of equipment that loads semiconductor devices manufactured by a certain process onto a test tray, supports a tester to test the semiconductor devices loaded onto the test tray, sorts the semiconductor devices according to the test result, and then unloads the semiconductor devices from the test tray onto customer trays. Technology related to the test handler has been disclosed through many publications, such as Korean Patent No. 10-0553992 (hereinafter, referred to as prior art).

In general, the produced semiconductor devices are loaded onto customer trays and then transferred to the test handler. The semiconductor devices are loaded from a customer tray onto a test tray located at a loading site. The semiconductor devices loaded onto the test tray are moved via a test site to an unloading site and then unloaded onto a customer tray.

While the semiconductor devices are moving within the test handler, they are tested at the test site by a tester docked to the test handler. Specifically, a pushing apparatus pushes the semiconductor devices placed on inserts of the test tray to test sockets of the tester. The conventional pushing apparatus includes: a match plate for matching with a test tray; and a cylinder-piston unit for pushing and pulling the match plate toward and from the test tray. The match plate is configured in such a way that a plurality of pushers is coupled in an installation plate, in a matrix. The pushers correspond to the inserts of the test tray, one by one. The pushers serve to push the semiconductor devices placed on the inserts to the test sockets of the tester, so that the semiconductor devices can be contacted with the test sockets.

Since the semiconductor devices are used in various environments, they are tested under poor temperature conditions prepared in the test handler. To this end, the conventional test method just supplies air (cool- or heated-) to the test site so as to maintain the semiconductor devices located at the test site at the required temperature. However, the temperature of the semiconductor devices, close to the air supplying apparatus, differs from that of the semiconductor devices, far from the air supplying apparatus. That is, because the semiconductor devices close to the air supplying apparatus maintain around the temperature of the supplied air, but the semiconductor devices far from the air supplying apparatus contact the supplied air through convection. Therefore, the conventional test method has a disadvantage in that all the semiconductor devices placed on the test tray located at the test site cannot be under the same temperature conditions, thus deteriorating test reliability. That is, the conventional test method causes temperature deviation among semiconductor devices at the same test site, so that they are tested in different test conditions. Of course, it is natural that the semiconductor devices at the same test site are subject to undergo some of temperature deviation, however, it should be noted that as the temperature deviation increases, the test results becomes less reliable.

In order to resolve such a problem, as disclosed in the prior art, the present applicant of this application has developed a technique where air can be supplied individually to the respective semiconductor devices placed on a test tray. As disclosed in the prior art, the prior test method allows air to be directly supplied from the duct to the semiconductor devices, and thus can maintain all semiconductor devices located at the test site within the temperature deviation of 2° C., unlike the conventional method that uses the air convection principle.

The ideal test condition is when all of the semiconductor devices are subject to the same temperature at the test site. To this end, techniques must be developed to reduce any temperature deviations among semiconductor devices at the test site.

When the number of semiconductor devices to be tested at one time (once) is increased, temperature deviation among the semiconductor devices is probably increased. This is due to the fact that the semiconductor devices to be tested are subject to the thermal state of the ambient air temperature thereof. Specifically, the ambient air of the semiconductor devices placed in the center portion of the test site is hardly affected by the outside air, but the ambient air of the semiconductor devices placed in the outer portion of the test site is affected by the outside air. Therefore, if the number of semiconductor devices to be tested once is increased, the temperature deviation increases in proportion to the distance between the semiconductor devices in the center portion of the test site and the semiconductor devices in the outer portion.

It is preferable that air is supplied to the respective semiconductor devices and, at the same time, to the test site so that the environment surrounding the semiconductor devices can be maintained under a proper temperature state during the test.

As described above, the math plate is configured to include an installation plate and a plurality of pushers installed to the installation plate in a matrix.

Referring to FIG. 1, each pusher 100 includes: a body part 110; and a pushing part 120 that extends forward from the front side of the body part 110, for pushing a semiconductor device (D) placed on an insert of a test tray. The pusher 100 forms an air through hole 130 through which air can be supplied to the semiconductor device. The air through hole 130 extends through from the rear side of the body part 110 to the front side of the pushing part 120, and allows air supplied from a duct (not shown) to flow to the semiconductor device (D), as illustrated by an arrow. As shown in FIG. 2, the front side of the pushing part 120 forms a cross-shaped groove 140 crossing the air through hole 130 and the cross-shaped groove 140 serves to provide a channel that allows air supplied to the semiconductor device (D) to flow out.

However, the prior art has a problem in that the amount of air supplied to the air through hole 130 is relatively small when considering the ambient air temperature of the semiconductor device (D).

To resolve this problem, if the air through hole 130 is increased in its diameter to allow a larger amount of air to be supplied, one semiconductor device (D) is subject to different pressures among its center portion (i.e., near the air through hole), a portion near the cross-shaped groove 140, and the outer portions of the semiconductor device (D). In that case, the semiconductor device (D) may be damaged. Consequently, there is limitation to increase the diameter of the air through hole 130. Similarly, it also causes that the width increment of the cross-shaped groove 140 must be limited.

As shown in FIG. 3, according to the prior art, since the insert (I) closely connects its sectional portion C to the pusher 100, the air passing through the air through hole 130 must be compulsorily discharged through the gap between the parts of the insert I. Although a large amount of air is supplied, at a high pressure, to the air through hole 130 from the duct, the channel is not sufficiently secured to allow the high pressure air to flow out, which causes that sufficient air cannot be supplied to the test site. Furthermore, there exists a high probability of damage occurring to parts of the insert while the high pressure air is flowing out through the gaps between the parts.

SUMMARY OF THE INVENTION

The present invention solves the above problems, and provides a pusher for a match plate of a test handler, which provides air to respective semiconductor devices located at a test site, allowing the semiconductor devices to undergo the same test conditions, and, at the same time, provides a sufficient amount of air to the test site.

In accordance with an exemplary embodiment of the present invention, there is provided a pusher for a match plate of a test handler including: a body part installed to an installation plate; and a pushing part that extends forward from a front side of the body part, for pushing a semiconductor device placed on an insert of a test tray.

Here, the pusher forms: an air through hole that extends through from a rear side of the body part to the front side of the pushing part, for guiding air of a certain temperature, supplied to the rear side of the body part from a duct, to be supplied to the semiconductor device placed on the insert of the test tray in front of the pushing part; and at least one or more air outflow holes that extend through from at least one side of the pushing part and communicate with the air through hole, for allowing part of the air to flow out to a test site.

Preferably, the body part may further form an air discharging groove on at least one side thereof, through which the air flowing out from the air through hole and the at least one or more air outflow holes is smoothly discharged to the test site.

Preferably, the air through hole has different inner diameters, one of which is formed from the rear side of the body part to a position where the at least one or more air outflow holes are formed and another of which is formed from the position where the at least one or more air outflow holes are formed to the front side of the pushing part, in which the one inner diameter is greater than the another inner diameter.

Preferably, the air through hole has different inner diameters, one of which is formed from the rear side of the body part to a specific position and another of which is formed from the specific position to the front side of the pushing part, in which the one inner diameter is greater than the another inner diameter. Also, the at least one or more air outflow holes are formed between the specific position and the front side of the pushing part.

Preferably, the air through hole has different inner diameters, one of which is formed from the rear side of the body part to a specific position and another of which is formed at the front side of the pushing part, in which the one inner diameter is greater than the another inner diameter. Also, a summation of the cross-sectional area of the air through hole at the front side of the pushing part and the cross-sectional area of at least one or more air outflow holes is smaller than or equal to the cross-sectional area of the air through hole formed from the rear side of the body part to the certain position.

In accordance with another exemplary embodiment of the present invention, a pusher for a match plate of a test handler including: a body part installed to an installation plate; and a pushing part that extends forward from a front side of the body part, for pushing a semiconductor device placed on an insert of a test tray.

Here, the pusher forms: an air supplying hole that extends through from a rear side of the body part to at least one side of the pushing part, for guiding air of a certain temperature, supplied to the rear side of the body part from a duct, to discharge to at least one side of the pushing part.

BRIEF DESCRIPTION OF THE DRAWINGS

The features and advantages of the present invention will be more apparent from the following detailed description in conjunction with the accompanying drawings, in which:

FIG. 1 is a cross-sectional view depicting a pusher for a match plate of a test handler according to prior art;

FIG. 2 is a perspective view depicting the pusher of FIG. 1;

FIG. 3 is a view describing the operation of the pusher of FIG. 1;

FIG. 4 is a perspective view depicting a pusher for a match plate of a test handler according to a first embodiment of the present invention;

FIG. 5 is a cross-sectional view depicting the pusher of FIG. 4, taken along line I, seen from the X-direction;

FIG. 6 is a cross-sectional view depicting the pusher of FIG. 4, taken along line J-J, seen from the Y-direction;

FIG. 7 is a view describing the operation of the pusher of FIG. 4;

FIG. 8 is a cross-sectional view depicting a pusher for a match plate of a test handler according to a second embodiment of the present invention;

FIG. 9 is a cross-sectional view depicting a pusher according to another embodiment of the present invention; and FIG. 10 is a cross-sectional view depicting a pusher according to an application example of the present invention.

BRIEF DESCRIPTION OF SYMBOLS IN THE DRAWINGS 400, 800, 1000: pusher
410, 820, 1010: body part
420, 820, 1020: pushing part
430, 830: air through hole
440: cross-shaped groove
450a, 450b: air discharging groove
460, 860: air outflow hole
1030: air supplying hole

DETAILED DESCRIPTION OF EXEMPLARY EMBODIMENTS

Hereinafter, exemplary embodiments of the present invention are described in detail with reference to the accompanying drawings. The same reference numbers are used throughout the drawings to refer to the same or similar parts. Detailed descriptions of well-known functions and structures incorporated herein may be omitted to avoid obscuring the subject matter of the present invention.

Embodiment 1

FIG. 4 is a perspective view depicting a pusher for a match plate of a test handler (hereinafter, referred to as a pusher) according to a first embodiment of the present invention. FIG. 5 is a cross-sectional view depicting the pusher of FIG. 4, taken along line I, seen from the X-direction.

As shown in FIG. 4 and FIG. 5, the pusher 400 includes a body part 410 and a pushing part 420. The pusher 400 forms an air through hole 430 that extends through from the rear side of the body part 410 to the front side of the pushing part 420. Although the pusher in the present embodiment is implemented in such a way that one pushing part is arranged in one body part, it should be understood that the pusher can be modified so that a plurality of pushing parts are arranged in parallel in one body part, and in this case, a plurality of semiconductor devices can be placed in parallel on one insert.

The body part 410 is installed to an installation plate (not shown). The body part 410 forms air discharging grooves 450a and 450b at both sides, which serve as channels through which air, flowing out from air outflow hole 460 of the pushing part 420, rapidly flows out to the test site.

The pushing part 420 extends forward from the front side of the body part 410 and makes contact with a semiconductor device in its front side. The front side of the pushing part 420 forms a cross-shaped groove 440 like the prior art. As shown in FIG. 5, the pushing part 420 forms the air outflow hole 460 at side. The air outflow hole 460 communicates with the air through hole 430. As shown in FIG. 6, the air outflow hole 460 is formed to communicate with the four side walls of the pushing part 420, forming a cross, with respect to the air through hole 430 as its center axis.

As shown in FIG. 5, the air through hole 430 is formed to have two inner diameters with two stages while extending through from the rear side of the body part 410 to the front side of the pushing part 420. That is, the air through hole 430 has a first inner diameter (L) extending through from the rear side of the body part 410 to the air outflow hole 460 and a second inner diameter (l) extending through from the air outflow hole 460 to the front side of the pushing part 420, in which the first inner diameter (L) is greater than the second inner diameter (l). Such a different inner diameter configuration allows the air through hole 430 to receive a large amount of air. That is, the air through hole 430 of the first inner diameter (L) allows the amount of air discharged to the test site through the air outflow hole 460 and the amount of air supplied to the semiconductor device through the front side of the pushing part 420 to flow. On the contrary, the air through hole 430 of the second inner diameter (l) allows only the amount of air supplied to the semiconductor device to flow. Therefore, the inner diameter of the air through hole 430 at the portion of the front side of pushing part 420 can be formed to be relatively small to prevent the semiconductor device from damage due to the inconsistent application of pressure at the front side of the pushing part 420.

The following is a description of the operation of the pusher 400 according to the present invention, referring to FIG. 7.

When a relatively large amount of air is directly supplied from the duct to the rear side of the body part 410, the air flows toward the semiconductor device (D) through the air through hole 430. While flowing, part of air flows out through the air outflow hole 460 and then part of air is discharged through the air discharging grooves 450a and 450b of the body part 410 to the test site. Also, part of air, supplied to the semiconductor device D through the front side of the pushing part 420, flows out to the periphery of the pushing part 420 through the cross-shaped groove 440 and is then discharged to the test site through the air discharging grooves 450a and 450b of the body part 410. In FIG. 7, the arrows represent the traveling paths of air supplied from the duct through the pusher 400.

In the present embodiment, the inner diameter of the air outflow hole 460 is greater than that of the air through hole 430 at the portion of the front side of the pushing part 420; however, it should be understood that the diameter sizes can be modified according to the design objective. If a large amount of air should be supplied to the semiconductor device, the inner diameter of the air through hole at the front side of the pushing part is greater than that of the air outflow hole. Otherwise, the inner diameter of the air outflow hole 460 is greater than that of the air through hole 430 likewise the present embodiment. Also, it should be understood that the air through hole can be formed to have a constant inner diameter, independent of the position within the air through hole, respect to the air outflow hole.

Embodiment 2

FIG. 8 is a cross-sectional view depicting a pusher for a match plate of a test handler according to a second embodiment of the present invention.

As shown in FIG. 8, the pusher 800 includes a body part 810 and a pushing part 820. The pusher 800 forms an air through hole 830 that extends through from the rear side of the body part 810 to the front side of the pushing part 820, and an air outflow hole 860 communicating with the air through hole 830 at side of the pushing part 820.

Similar to Embodiment 1, the air through hole 830 is formed to have two inner diameters with two stages. That is, the air through hole 830 has a first inner diameter (L') extending through from the rear side of the body part 810 to a specific position (P) and a second inner diameter (l') extending through from the specific position (P) to the front side of the pushing part 820, in which the first inner diameter (L') is greater than the second inner diameter (l'). In the present embodiment, the air outflow hole 860 is formed between the specific position (P) and the front side of the pushing part 820, communicating with the air through hole 830.

In the present embodiment, the summation of the cross-sectional area of the air through hole 830 of the second diameter (l') at the front side of the pushing part 820 and the cross-sectional area of the air outflow holes 860 is smaller than (or equal to) the cross-sectional area of the air through hole 830 of the first inner diameter (L'). Therefore, when a certain amount of air is provided to the air through hole 830, the air pressure at the air through hole 830 of the second inner diameter (l') is larger than (or equal to) that of the air pressure at the air through hole 830 of the first inner diameter (L').

In the Embodiment 2, the pusher 800 is designed in such a way that the air pressure at the air through hole 830 of the second inner diameter (l') is greater than that of the air through hole 830 of the first inner diameter (L'). Therefore, the air provided through the air through hole 830 can be properly distributed to the air through hole 830 at the front side of the pushing part 820 and the air outflow holes 860.

The pusher 400 described in Embodiment 1 is preferable when a relatively large amount of air will be directly supplied to the test site. On the contrary, the pusher 800 of Embodiment 2 is preferable when requiring a balance between the amount of air supplied to the semiconductor device and the amount of air directly discharged to the test site (that is, when most of the amount of air supplied to the air through hole should not be discharged through the air outflow holes).

In the embodiments according to the present invention, four air outflow holes are provided as a cross so as to evenly and smoothly provide air to the test site and the air through hole has two stages whose diameters differ from each other, however, it should be understood that the air outflow holes can be implemented to have a variety of numbers other than four and, as show in FIG. 9, the air through hole 930 can be implemented to have the same diameter in the body part 910 and the pushing part 920.

APPLICATION EXAMPLE

FIG. 10 is a cross-sectional view depicting a pusher according to an application example of the present invention.

Referring to FIG. 10, the pusher 1000 is configured to include a body part 1010 and a pushing part 1020. The pusher 1000 forms an air supplying hole 1030 that extends through from the rear side of the body part 1010 to the side of the pushing part 1020, which will be described in detail below. Unlike the embodiments above, the front side of the pushing part 1020 is closed.

The pusher 1000 according to this application example is utilized to indirectly heat or cool the semiconductor device by the air discharged to the periphery of the semiconductor devices, compared to the above described embodiments where the air is directly supplied to the semiconductor device through the air through hole. Heating and cooling a semiconductor device by the indirect method of the application example may be similar to the conventional convection method using a fan, however, the application example of the present invention is designed so that air is supplied to the portion adjacent to the semiconductor device and the semiconductor device receives air supplied from its all sides, unlike the conventional convection method using a fan. Therefore, the application example can reduce temperature deviation between the semiconductor devices.

Referring back to FIG. 10, the air supplying hole 1030 extends through from the rear side of the body part 1010 to a particular position (P'), where the air supplying hole 1030 turns to the side of the pushing part 1020, at a constant inner diameter. Also, as shown in FIG. 8, it should be understood that the pusher 1000 can be implemented in such a way that the air supplying hole 1030 is formed to have two stages, one of which is a large inner diameter extending through from the rear side of the body part to a specific position and another of which is a small inner diameter extending through from the specific position to the particular position (P'), where the air supplying hole turns to the outside of the pushing part.

As described above, the pusher for a match plate of a test handler according to the present invention can supply a large amount of air to the semiconductor devices and the test site and thus can keep the semiconductor devices and the ambient air at a uniform temperature to comply with the test condition, thereby reducing the temperature deviation among the semiconductor devices located at the test site. That is, the pusher of the present invention can allow all the semiconductor devices to be tested under an almost ideal test environment.

Although exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined in the appended claims.

What is claimed is:

1. A pusher for a match plate of a test handler, the pusher comprising:
    a body part installed to an installation plate; and
    a pushing part that extends forward from a front side of the body part, for pushing a semiconductor device placed on an insert of a test tray,
    wherein the pusher forms:
        an air through hole that extends through from a rear side of the body part to the front side of the pushing part, for guiding air of a certain temperature, supplied to the rear side of the body part from a duct, to be supplied to the semiconductor device placed on the insert of the test tray in front of the pushing part, and
        at least one air outflow hole that extends through from at least one side of the pushing part for communicating with the air through hole and for allowing a portion of the air supplied from the duct via the air through hole to flow out to a test site, the at least one air outflow hole is spaced apart from the front side of the pushing part.

2. The pusher of claim 1, wherein the body part comprises an air discharging groove on at least one side thereof, through which the air flowing out from the air through hole and the at least one air outflow hole is smoothly discharged to the test site.

3. The pusher of claim 1, wherein the air through hole comprises different inner diameters, one of the inner diameters of the air through hole is formed from the rear side of the body part to a position where the at least one air outflow hole is formed and another inner diameter of the air through hole is formed from the position where the at least one air outflow hole is formed to the front side of the pushing part, one inner diameter is greater than the other inner diameter.

4. A test handler comprising a pushing apparatus for pushing semiconductor devices, placed on inserts of a test tray, toward test sockets, the pushing apparatus comprising:
    a match plate comprising an installation plate and a pusher installed in the installation plate in a matrix for matching the test tray; and
    a driving source for moving the match plate toward and from the test tray,
    wherein, the pusher comprises a body part installed to an installation plate, a pushing part extending forward from a front side of the body part for pushing a semiconductor device placed on an insert of a test tray, an air through hole comprising different inner diameters and extending through from a rear side of the body part to the front side of the pushing part for guiding air of a certain temperature, supplied to the rear side of the body part from a duct, to be supplied to the semiconductor device placed on the insert of the test tray in front of the pushing part, and at least one air outflow hole that extends from at least one side of the pushing part for communicating with the air through hole and for allowing a portion of the air supplied from the duct via the air through hole to flow out to a test site, and
    further wherein one of the inner diameters of the air through hole is formed from the rear side of the body part to a position where the at least one air outflow hole is formed and another inner diameter of the air through hole is formed from the position where the at least one air outflow hole is formed to the front side of the pushing part.

5. A test handler comprising a pushing apparatus for pushing semiconductor devices, placed on inserts of a test tray, toward test sockets, the pushing apparatus comprising:

a match plate comprising an installation plate and a pusher installed in the installation plate in a matrix for matching the test tray; and a driving source for moving the match plate toward and from the test tray, wherein, the pusher comprises a body part installed to an installation plate, a pushing part extending forward from a front side of the body part for pushing a semiconductor device placed on an insert of a test tray, and an air supplying hole comprising different inner diameters and extending from a rear side of the body part to at least one side of the pushing part for guiding air of a certain temperature, supplied to the rear side of the body part from a duct, to discharge to at least one side of the pushing part, and further wherein one of the inner diameters of the air supplying hole is formed from the rear side of the body part to a position where at least one air outflow hole is formed and another inner diameter of the air supplying hole is formed from the position where the at least one air outflow hole is formed to the front side of the pushing part.

* * * * *